(12) United States Patent
Chang

(10) Patent No.: US 8,569,188 B2
(45) Date of Patent: Oct. 29, 2013

(54) ONE PIECE SHIM

(75) Inventor: Kenny Chang, Union, KY (US)

(73) Assignee: Messier-Bugatti-Dowty, Velizy-Villacoublay (FR)

( * ) Notice: Subject to any disclaimer, the term of this patent is extended or adjusted under 35 U.S.C. 154(b) by 2142 days.

(21) Appl. No.: 10/547,688

(22) PCT Filed: Mar. 2, 2004

(86) PCT No.: PCT/EP2004/002144
§ 371 (c)(1),
(2), (4) Date: Feb. 23, 2006

(87) PCT Pub. No.: WO2004/078406
PCT Pub. Date: Sep. 16, 2004

(65) Prior Publication Data
US 2006/0180085 A1 Aug. 17, 2006

Related U.S. Application Data

(60) Provisional application No. 60/450,678, filed on Mar. 3, 2003.

(51) Int. Cl.
*D03D 9/00* (2006.01)
*D03D 15/00* (2006.01)
*D03D 19/00* (2006.01)

(52) U.S. Cl.
USPC .............. 442/6; 442/2; 442/228; 442/229

(58) Field of Classification Search
USPC ..................... 442/2, 6, 228, 229
See application file for complete search history.

(56) References Cited

U.S. PATENT DOCUMENTS

| | | | | | |
|---|---|---|---|---|---|
| 2,900,182 | A | * | 8/1959 | Hinks | 267/282 |
| 3,429,622 | A | * | 2/1969 | Lee et al. | 403/291 |
| 3,958,840 | A | * | 5/1976 | Hickox et al. | 384/129 |
| 4,030,564 | A | * | 6/1977 | Itagaki | 181/166 |
| 4,154,322 | A | | 5/1979 | Yamamoto et al. | |
| 4,227,858 | A | * | 10/1980 | Donguy | 416/134 A |
| 4,304,178 | A | * | 12/1981 | Haberle | 100/323 |
| 7,182,980 | B2 | | 2/2007 | Goujard et al. | |

FOREIGN PATENT DOCUMENTS

| | | |
|---|---|---|
| EP | 1 158 568 | 11/2001 |
| FR | 2 754 813 | 4/1998 |
| FR | 2 821 859 | 9/2002 |
| GB | 419 949 | 11/1934 |

* cited by examiner

*Primary Examiner* — Andrew Piziali
(74) *Attorney, Agent, or Firm* — Pillsbury Winthrop Shaw Pittman, LLP

(57) ABSTRACT

A one-piece or otherwise unitary annular shim member made from a perforated metallic material is used to maintain a space between stacked annular preforms during a manufacturing process, such as densification. The metallic material used preferably can withstand at least the temperatures encountered during densification. The one-piece structure advantageously simplifies the arrangement of the preforms in a process chamber and causes less deformation in the preforms. In one example, the shim member is made from a metallic mesh and may utilize a crimped weave structure.

18 Claims, 2 Drawing Sheets

ONE PIECE SHIM

This application is a §371 national phase filing of PCT/EP2004/002144 filed Mar. 2, 2004, and claims priority to a U.S. provisional application No. 60/450,678 filed Mar. 3, 2003.

BACKGROUND OF THE INVENTION

The present invention relates to shim members used to space apart stacked porous substrates during a manufacturing process. A particular example of the present invention relates to metallic annular shim members used to space apart stacked annular composite material preforms especially during a densification process, such as chemical vapor infiltration (CVI).

The composite material preforms may particularly be annular preforms for making brake disks or other friction members.

An apparatus for densifying annular preforms to make brake disks and the like is disclosed in, for example, U.S. patent application Ser. No. 10/468,031 filed on Aug. 14, 2003; a representation thereof is illustrated in FIG. 1.

FIG. 1 is a highly diagrammatic illustration of a process chamber having an enclosure 10 therein containing a load of annular preforms or substrates 20 made from carbon fiber. The load is in the form of a stack of substrates having their respective central passages generally in vertical alignment. The stack may be made up of a plurality of superposed stack sections separated by one or more intermediate support plates 12.

The stacked substrates are separated from one another by means of spacers 30. As shown in FIG. 2, the spacers 30 may be disposed radially, and the number of them may vary. They provide gaps 22 of substantially constant height throughout the entire stack between adjacent substrates, while allowing the inside volume 24 of the stack, as constituted by the generally aligned central passages of the substrates, to communicate with the outer volume 26 situated outside the stack and inside the enclosure 10.

In the example of FIG. 1, the enclosure 10 contains a single stack of substrates. In a variant, a plurality of stacks of substrates may be disposed side by side in the same enclosure.

The enclosure 10 is heated by means of a susceptor 14, e.g. made of graphite, which serves to define the enclosure 10 and which is inductively coupled with an induction coil 16 situated outside a casing 17 surrounding the susceptor. Other methods of heating may be used, for example resistive heating (the Joule effect).

A gas containing one or more precursors of carbon, typically hydrocarbon gases such as methane and/or propane, is admitted into the enclosure 10. In the example shown, admission takes place through the bottom 10a of the enclosure. The gas passes through a preheater zone 18 formed by one or more pierced plates disposed one above another in the bottom portion of the enclosure, beneath the plate 11 supporting the stack of substrates. The gas heated by the preheater plates (which are raised to the temperature that exists inside the enclosure) flows freely into the enclosure, passing simultaneously into the inside volume 24, into the outer volume 26, and into the gaps 22. The residual gas is extracted from the enclosure by suction through an outlet formed in the cover 10b.

Spacers 30 are individually placed block members, most usually made from alumina. However, once formed, the alumina block members are very fragile, and losses from breakage are very high. In fact, in normal usage, the conventional alumina blocks frequently last not more than 2 or 3 densification cycles. This naturally raises manufacturing costs, as the alumina blocks must be replaced.

Moreover, the proper manual placement of individual alumina block members between each preform layer is extremely time-consuming. Six such block members are shown in FIG. 2 by way of illustrative example, and in actual practice as many as twelve blocks are used. The time burden is exacerbated by the extraordinary care needed to handle the fragile blocks without breakage. In general, a full densification process comprising seven trays of preforms (each with twelve to fourteen preform stacks) can take as long as one or two working days to set up according to the conventional method.

Another problem related to the use of individual spacer members 30 is that they tend to cause deformations (literally, dents) in the preforms caused by the weight of preforms (and spacers) stacked thereabove. As can be appreciated from FIG. 2, there are large unsupported areas of the preform circumferentially between the spacer members 30. Because the preform material is generally pliable, and because the alumina constituting spacer members 30 does not deform, indentations occur in the surface of the preforms in locations corresponding to the spacer members 30. These deformations, however slight, must be machined away in an extra finishing step so as to obtain a desirably planar surface usable for friction applications. As a result, the thickness of each preform is thicker than is needed for a final product, in anticipation of the deformations that occur in the known process and of the final machining step to remove those deformations. The machined-away material represents economic waste.

SUMMARY OF THE PRESENT INVENTION

In view of the foregoing, the present invention relates to a one-piece or otherwise unitary annular shim member for spacing apart stacked annular preforms.

A shim member according to the present invention has a generally flattened annular form with opposing first and second surfaces. At least one of the surfaces includes is shaped to at least partially define radially extending gas flow paths for communicating the interior space of the shim member with an exterior.

A shim member according to the present invention is preferably similar in radial dimensions to the annular preforms adjacent thereto. That is, the shim member preferably has a similar interior diameter and a similar exterior diameter to the annular preforms. If the shim member is not generally identical in size to the annular preforms, it is preferable to slightly undersize the shim member (i.e., have an interior diameter greater than and/or an exterior diameter less than the annular preforms), rather than have the shim member be larger (i.e., radially wider) than the annular preforms.

In one example of the present invention, the shim member is made from a metallic material having openings formed therethrough, including, without limitation, a metal mesh material. The metallic material may be bare (i.e., without a coating, including without a debonding coating), which makes manufacture and refurbishment correspondingly simpler and less expensive.

BRIEF DESCRIPTION OF THE DRAWINGS

The present invention will be even better understood with reference to the figures attached hereto, in which.

It is expressly emphasized that the figures herein are meant to merely illustrate examples of the present invention and are not to be construed as limiting the definition thereof in any way. It is also noted that the figures herein are not necessarily to scale, either in general or among interrelated views.

DETAILED DESCRIPTION OF THE PRESENT INVENTION

In general, a shim member according to the present invention has certain fundamentally useful characteristics.

A one-piece or otherwise unitary construction greatly facilitates the loading of a process chamber with stacked annular preforms, in comparison to the use of several individual spacer members between every annular preform in the stack. As noted above, the conventional arrangement described above with reference to FIG. 2 requires manual placement of each conventional spacer member. Moreover, because the conventional spacer member is usually made from a highly fragile material such as alumina, each spacer member must be handled with great care during an already lengthy and tedious manual process to try to avoid breakage. The spacer members are also relatively small and very thin (for example, 1"×4"×0.1"), which also makes handling them difficult.

With the use of a one-piece shim member according to the present invention, a single action of positioning the shim member replaces the several placement actions of positioning individual spacer members according to the conventional method. In comparison to the one to two days to load a process chamber in the conventional manner discussed above, the use of a one-piece shim according to the present invention could, on an equal basis, reduce loading times down to two to four hours.

Figure 2:
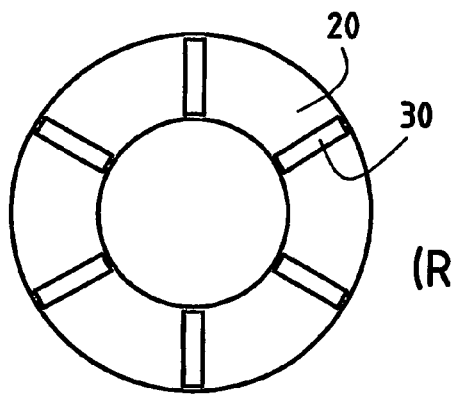
FIG. 2 illustrates an arrangement of individual spacer members for spacing apart the stacked annular preforms illustrated in FIG. 1.
Figure 1:
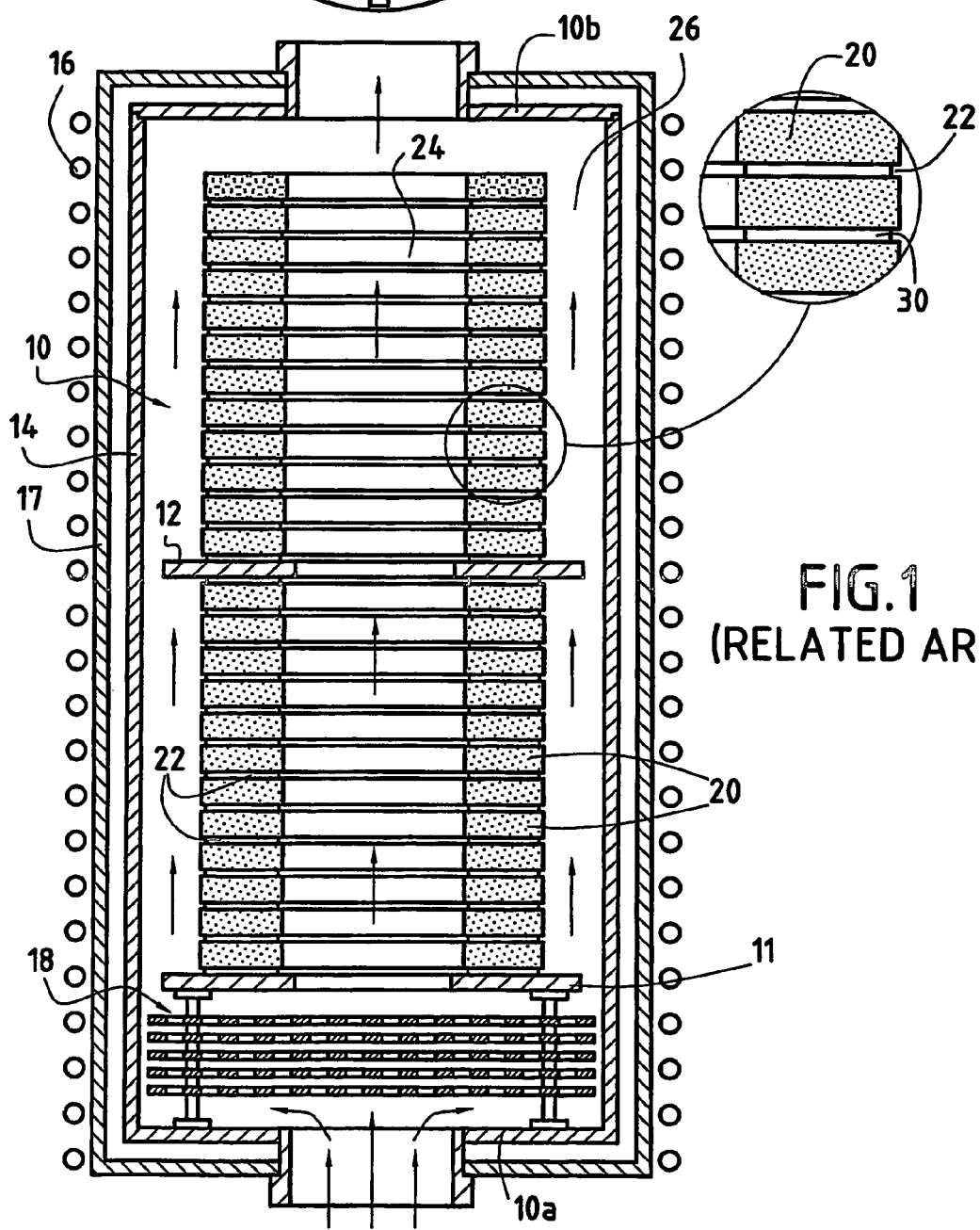
FIG. 1 illustrates a process chamber for densifying stacked annular preforms.

In addition, the structure of the one-piece shim member according to the present invention better supports the weight of the one or more annular preforms stacked thereon over a greater area, in comparison to the conventional use of individual spacer members, as illustrated in FIG. 2. In particular, the radial width of the annular one-piece shim member should be about equal to or slightly narrower than that of the annular preforms. As a result, each annular preform is less deformed after being removed from the process chamber. This means that less remedial machining is required after the densification process to obtain a usefully undeformed surface.

As just mentioned, the one-piece shim member preferably has about the same radial width as the annular preform, or is slightly narrower (for example, by about 5 mm with respect to the outside and/or inner diameters thereof). If the one-piece shim member were wider than the annular preform, the exposed portions would tend to have a residue build up (such as pyrolytic carbon) thereon from the decomposition of the densification gas. This would either reduce the useful life of the shim member or entail additional refurbishment procedures to remove such buildup. In addition, if the shim member extended radially outward beyond the outside edge of the annular preforms, it could cause a problem in positioning several annular preform stacks in a process chamber for simultaneous processing (as is frequently done). This would negatively affect production efficiency to the extent that fewer stacks could be processed together because of spacing issues within the process chamber.

In general, the one-piece shim member according to the present invention includes radially extending channels or other features on one or both surfaces thereof that, in net effect, at least partly define gas flow paths communicating the radially interior side of the one-piece shim member with the radially exterior side thereof. The mention of "partly" defined gas flow paths is made here because in some cases, the gas flow paths are also partly defined by the opposing surface of one of the annular preforms in cooperation with the structure of the one-piece shim member. The cross-sectional area of the gas flow paths using the one-piece shim is preferably comparable, in net effect, to the cross-sectional area presented in the prior art arrangement. However, this consideration may vary in accordance with individual situations.

It will be appreciated that the collective cross-sectional area of the gas flow paths presented can be affected, for example, by either adjusting the size of each channel or the like, or by providing more of the channels or the like. A deciding factor in this regard is maintaining a desirable level of support for the overlying annular preform(s).

Generally, the one-piece shim member according to the present invention should be made from a material that can withstand temperatures of up to about 1000° C., and preferably (for safety purposes) up to about 1200° C. to 1400° C. The chosen material is preferably minimally reactive with the preform at the operational temperatures mentioned.

Examples of materials appropriate for the one-piece shim member as contemplated include metallic materials such as, without limitation, stainless steel, a nickel-chromium-based alloy (such as an INCONEL® alloy from Special Metals Corp. of Huntington, W. Va.), titanium, molybdenum, tantalum, and tungsten.

Figure 3A:
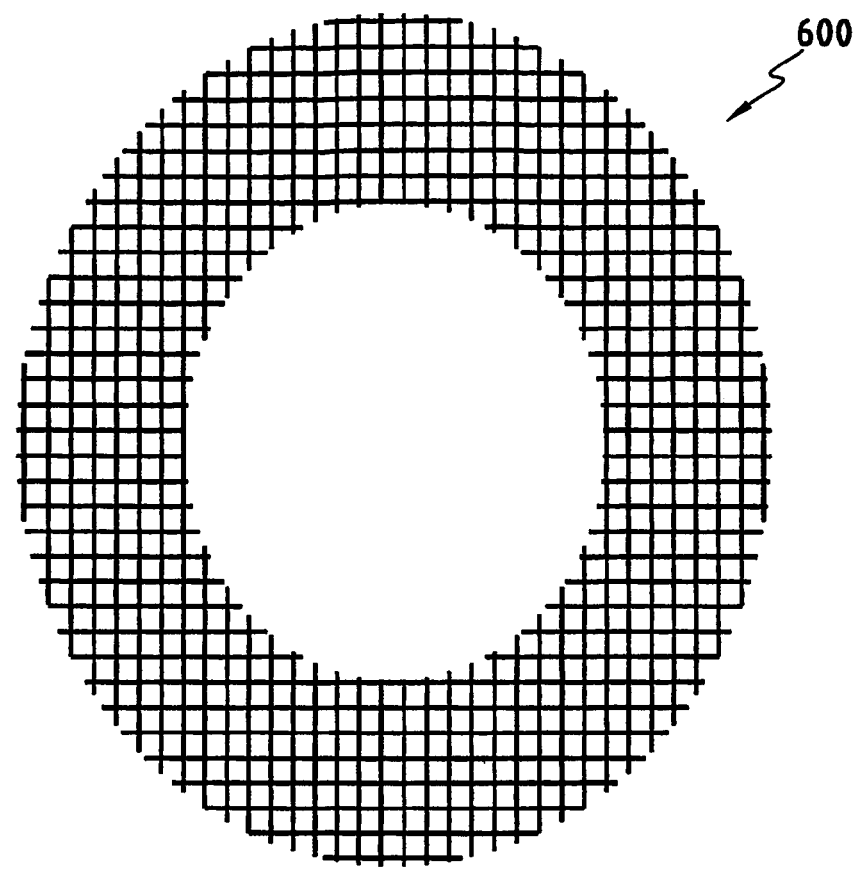
FIGS. 3a and 3b illustrate an example of a one-piece shim member according to the present invention.
Figure 3B:
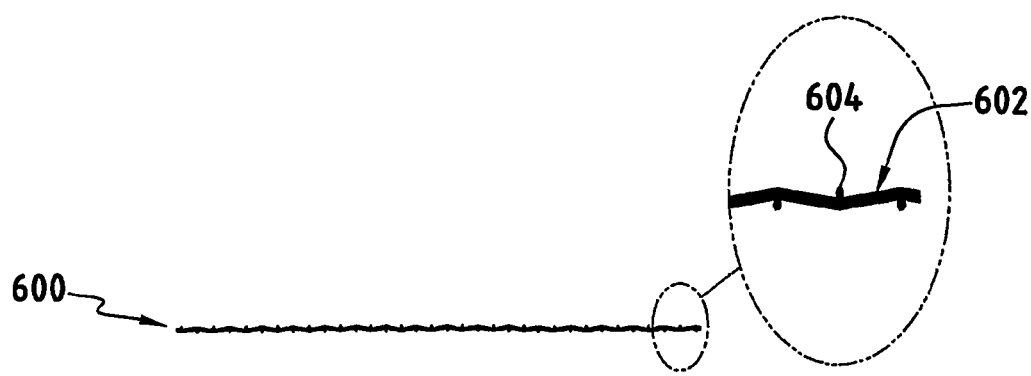

FIG. 3a is a plan view of another example of an annular shim member 600 according to the present invention, and FIG. 3b is a corresponding elevational view including a magnified partial portion thereof.

Annular shim member 600 is generally made from a perforated metallic material having an open area of about 20% to about 80%. In a particular example thereof, annular shim member 600 is made from a metallic mesh material.

The metallic material used to make annular shim member 600 must, as mentioned above, be able to withstand temperatures of up to about 1100° C., and preferably (to provide a safety factor) up to about 1200° C. to 1400° C. Stainless steel, a nickel-chromium-based alloy (e.g., an INCONEL® alloy), titanium, molybdenum, tantalum, and tungsten are all appropriate examples of suitable metallic materials.

The metallic material can be a refractory material.

Annular shim member 600 may be formed by cutting an appropriately sized annular form from a sheet of stock material. Any appropriate industrial cutting method can be used, including, without limitation, computer-controlled laser cutting.

FIGS. 3a and 3b illustrate an example of the use of a mesh material to make annular shim member 600. As can be clearly seen in the magnified portion of FIG. 3b, the mesh material be a woven mesh manufactured according to known methods, especially including crimped weave methods. A crimped weave mesh refers to preshaping (i.e., crimping) the wires in at least one direction in the mesh. See, for example, the crimped wire 602 illustrated in FIG. 3b, relative to the wires 604. Thus, the undulations in wire 602 present, in effect, open spaces adjacent to transverse wires 604. These open spaces (which are interconnected over the area of annular shim member 600) collectively provide the passages through which the densification gas can pass between an interior of annular shim 600 and an exterior thereof.

In general, the thickness of the annular shim member 600 is about twice the diameter of a wire 602 or 604. In one example, the overall thickness of annular shim member 600 is between 1 mm and about 6 mm.

Annular shim member 600 has significantly different thermal expansion characteristics than the annular preforms so adhesions therebetween are negligible, and the debonding coating of the carbon annular shim can be omitted. Furthermore, the metallic mesh can be easily and simply reconditioned by, for example, sandblasting.

Some degree of metal contamination in the preforms is possible due to the temperatures at which densification takes place. However, it is believed that the depth of such contamination is negligible in view of the amount of material lost to surface machining and the like in the normal course of manufacture (for example, intermediate machining to reopen the porosity of the preforms so that densification can advance). As a result, what contamination there may be is usually removed anyway.

While the present invention has been described with respect to what are believed to be the most practical embodiments thereof, it is particularly noted that this is by way of example only, and appropriate modifications and variations thereof are possible within the spirit and scope of the claims appended hereto.

What is claimed is:

1. An annular shim member having first and second opposing surfaces and a plurality of openings formed therethrough, wherein the member is made from a metallic material, has an effective thickness of about 1 mm to about 6 mm, and at least partly defines a plurality of radially extending gas flow paths for communicating a radially interior side of the member with a radially exterior side of the member, the annular shim member being substantially planar.

2. The member according to claim 1, wherein the metallic material is a bare metallic material.

3. The member according to claim 1, wherein the metallic material is a wire mesh.

4. The member according to claim 3, wherein the metallic material is a refractory material.

5. The member according to claim 3, wherein the metallic member comprises one or more of stainless steel, a nickel-chromium-based alloy, titanium, molybdenum, tantalum, and tungsten.

6. The member according to claim 3, wherein the wire mesh has an open mesh area of about 20% to about 80%.

7. The member according to claim 3, wherein the wire mesh includes a crimped weave mesh.

8. The member according to claim 3, wherein the member has an effective thickness of about twice the diameter of the wire constituting the wire mesh.

9. The member according to claim 4, wherein the refractory material can withstand temperatures of up to about 1400° C.

10. An annular shim member having first and second opposing surfaces and a plurality of openings formed therethrough, wherein the member is made from a metallic material, has an effective thickness of about 1 mm to about 6 mm, and at least partly defines a plurality of radially extending gas flow paths, the annular shim member being substantially planar.

11. The member according to claim 10, wherein the metallic material is a bare metallic material.

12. The member according to claim 10, wherein the metallic material is a wire mesh.

13. The member according to claim 12, wherein the metallic material is a refractory material.

14. The member according to claim 12, wherein the metallic member comprises one or more of stainless steel, a nickel-chromium-based alloy, titanium, molybdenum, tantalum, and tungsten.

15. The member according to claim 12, wherein the wire mesh has an open mesh area of about 20% to about 80%.

16. The member according to claim 12, wherein the wire mesh includes a crimped weave mesh.

17. The member according to claim 12, wherein the member has an effective thickness of about twice the diameter of the wire constituting the wire mesh.

18. The member according to claim 13, wherein the refractory material can withstand temperatures of up to about 1400° C.

* * * * *